United States Patent [19]
Molthen

[11] 3,992,691
[45] Nov. 16, 1976

[54] ELECTRONIC CIRCUIT BOARD FLAT COIL INDUCTOR

[75] Inventor: Edward H. Molthen, Ramona, Calif.
[73] Assignee: Cubic Corporation, San Diego, Calif.
[22] Filed: July 2, 1975
[21] Appl. No.: 592,389

[52] U.S. Cl. .............................................. 336/200
[51] Int. Cl.² ..................... H01F 5/00; H01F 27/28
[58] Field of Search ............. 336/200, 232; 29/602, 29/605; 174/68.5; 338/283, 290, 284, 285, 286, 287, 288, 289, 292, 293, 294

[56] References Cited
UNITED STATES PATENTS

| | | | |
|---|---|---|---|
| 3,033,914 | 5/1962 | Acosta-Lleras | 174/68.5 |
| 3,185,947 | 5/1965 | Freymodsson | 336/200 |
| 3,731,005 | 5/1973 | Shearman | 336/200 X |
| 3,812,442 | 5/1974 | Muckelroy | 336/200 X |

Primary Examiner—Thomas J. Kozma
Attorney, Agent, or Firm—Brown & Martin

[57] ABSTRACT

An inductor is developed on an electronic circuit board by forming plural parallel series of holes and plating a conductor pattern on both sides of the board in association with the holes. The holes are plated through with conductive material and are electrically connected by connective segments from the conductive pattern in the form of elongated straps. Each strap extends between a hole in a first series of holes to a hole in the second series of holes. The straps are arranged to produce a conductive pattern in a flattened generally helical form. The holes are drilled oversized so that, after plating, the remaining opening corresponds to a standard lead diameter. Connections may be made between a selected number of turns of the coil by inserting the leads of a circuit component in holes corresponding to the proper number of turns. The holes may be alternately staggered in relation to the control axis of the coil to maximize the number of turns in the coil for a given surface area of electronic circuit board.

2 Claims, 6 Drawing Figures

ELECTRONIC CIRCUIT BOARD FLAT COIL INDUCTOR

BACKGROUND OF THE INVENTION

Electronic circuitry, particularly in radio frequency (RF) applications, frequently employs inductive components. Such components are generally bulkier and more susceptible to damage and misalignment during installation and use than similar capacitive and resistive components. As a result, there is a tendency to design around the need for inductive components even in those circumstances where the inductive component provides the most direct solution to a particular circuit problem. Such non-inductive circuit designs have less than optimum operating characteristics.

Another common technique to reduce the required number of inductive components is to tap an inductor at one or more points along its length to thereby serve functions that would otherwise be fulfilled by a plurality of inductors. Inductive components utilized in this fashion are normally wound on cylindrical or toridal coil forms. The tapped connections are made at appropriate points along the axial extent of the inductor. However, points at which each connection is made to obtain the precise turns ratio desired cannot be easily determined. Therefore, there may be significant differences in successive tapped sections of the coil, to result in a variation in the electrical parameters, such as a phase shift, of a signal passed through the tapped coil. Similarly, the assembly process and in service use of the coil may physically distort the coil changing the operating characteristics. Such changes can require laborous set-up inspection in assembly and frequent service in use.

Therefore, it is desirable to have a coil inductor for electronic circuits that may be easily configured to have any selected inductance and number of tap points and particularly where such a coil resists physical distortion and therefore cause a predictable phase shift effect in a processed signal.

SUMMARY OF THE INVENTION

In an exemplary embodiment of the invention, a coil inductor is generated by depositing conductive material such as metallic copper in a pattern on opposite sides of a generally flat electronic circuit board. The conductive pattern is deposited in association with at least a first and second series of holes extending along opposite sides of the central axis of the coil. The first series of holes is parallel to the second. The first and second series are interconnected electrically by a series of conductive straps and pads that extend between holes in the two series of holes. The conductive pattern is also plated through the holes to produce a layer of deposited conductive material on the walls of the holes and to thereby interconnect the conductive patterns on the upper and lower surfaces. The result is a conductive path that extends in a flattened generally helical pattern from a first hole, across the first surface of the board to a hole in the opposite series of holes, through a plated hole, along a strap on a second surface of the board, and through a second hole to emerge adjacent to the first hole on the first surface of the board and continuing in a like manner to generate the flat helical conductive pattern. The plated through holes are drilled oversized so that after plating the remaining hole opening has a diameter corresponding to the lead diameter of the components utilized in the remainder of the circuit.

It is therefore an object of the invention to provide a new and improved coil inductor.

It is another object of the invention to provide a new and improved method of manufacturing a coil inductor.

It is another object of the invention to provide a new and improved coil inductor that may be developed on the surfaces of an electronic circuit board.

It is another object of the invention to provide a new and improved coil inductor that may be manufactured with a minimum labor expense.

It is another object of the invention to provide a new and improved coil inductor which has a phase repeatable characteristic.

It is another object of the invention to provide a new and improved coil inductor that has stable electronic characteristics in installation and use.

It is another object of the invention to provide a new and improved coil inductor that may be applied to the surfaces of an electronic surface board in a minimum surface area per unit of inductance.

Other objects and many attendant advantages of the invention will become more apparent upon a reading of the following detailed description, together with the drawings in which like reference numerals refer to like parts throughout and in which.

DETAILED DESCRIPTION OF THE DRAWINGS

Figure 1:
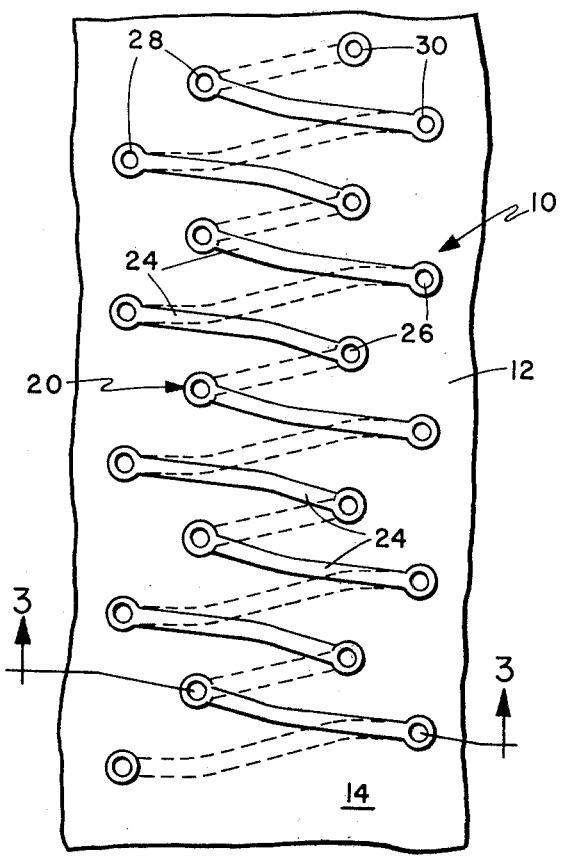
FIG. 1 illustrates one face of a circuit board on which a flat coil inductor has been plated.

Referring now to the drawings, there is illustrated a flat coil inductor 10 according to the invention. The inductor is shown as having been developed on the surfaces of an electronic circuit board 12. The electronic circuit board may be of fiberglass or other material having substantial mechanical strength and with a non-conductive surface. The board has a first surface 14 and a second surface 16 providing opposed parallel flat surfaces on which a plurality of circuit components 18 are mounted.

Figure 3:
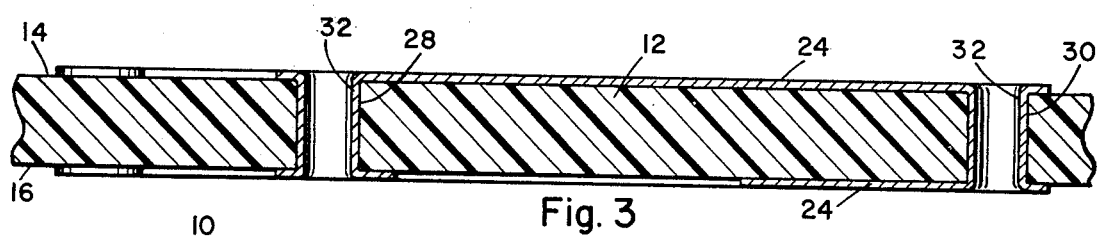
FIG. 3 is an enlarged sectional view taken on line 3—3 of FIG. 1.

The coil 10 is comprised of a first conductor pattern 20 on a first surface 14 of the board and a second conductor pattern 22 on the second surface 16 of the board. Each conductor pattern comprises a plurality of straps 24 which connect between holes 26. The holes are arranged in a first and second series of holes. The first series of holes 28 is arranged in a generally linear fashion parallel to and spaced from the second series of holes 30. Each of the holes 26 is plated through with conductive material 32 to interconnect between the conductive patterns 20 and 22, as in FIG. 3. The plated through holes 26 complete an electrical circuit extending along the length of the coil 10 in a flattened generally helical configuration. The conductive path extends from an initial hole 26, along a strap 24 on the first surface 14, through a plated through hole 26, along a conductive strap 24 on the second surface 16, and through a hole 26 adjacent to the initial hole 26 continuing along the length of the coil in the flat helical pattern as described. The thickness of the conductive layer in the plated through hole 26 is such that a clear opening remains between the two surfaces of the board into which a lead from a component may be inserted. In the exemplary embodiment, the holes 26 are first drilled to a dimension of 0.034 inches. The plating accounts for 0.003 inches of the diameter of the hole with a resulting finished hole opening of 0.031 inches. Thus, the finished opening corresponds to the lead diameter of many standard components.

Figure 5:
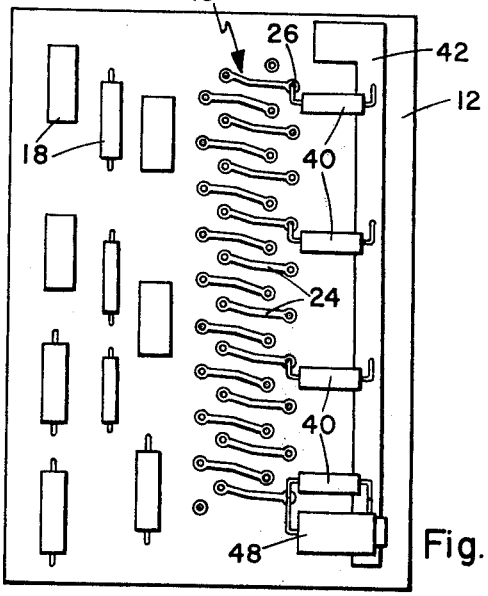
FIG. 5 illustrates a typical printed circuit unit incorporating the plated coil in a tuned circuit.

Referring specifically to FIG. 5, there are illustrated a plurality of capacitors 40, which are connected to the coil 10 by inserting one lead of each of them into selected holes 26. The other lead of each capacitor is connected to ground strip 42.

Figure 6:
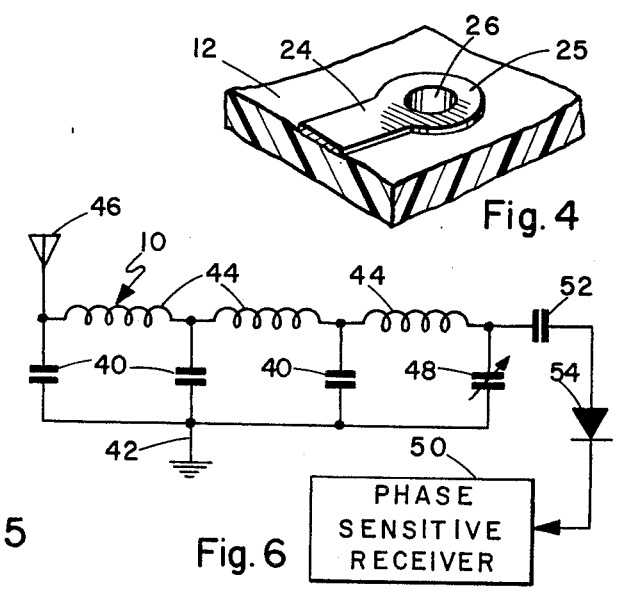
FIG. 6 is a schematic diagram of the tuned circuit of FIG. 5.

A schematic representation of the circuit of FIG. 5 is illustrated in FIG. 6. It will be noted that the coil 10 has been effectively tapped by the capacitors 40 and divided up into tapped segments 44. The coil segments 44 are incorporated into an RF filter for reducing RF interference at predetermined frequencies. The signal from the antenna 46 passes through the coil segments 44 which, in conjunction with the capacitors 40, pass undesired signals to ground 42. A trimmer capacitor 48 is utilized to make final adjustments to the circuit. The output of the filter is coupled to a receiver 50 through capacitor 52 and diode 54. Since the receiver 50 is phase sensitive, it is important to retain a predetermined phase relationship between the incoming signal from the antenna 46 and the processed signal as delivered to the receiver 50. Thus it is necessary to tap each inductor segments 44 at precisely the same turn relationship as all the other inductor segments 44. This phase relationship must also be maintained in service. According to the invention, the proper phase relationship is inherently maintained to a high degree of accuracy by the rigid and regular configuration of the coil 10 and by the self-contained tap points provided by the holes 26.

Figure 2:
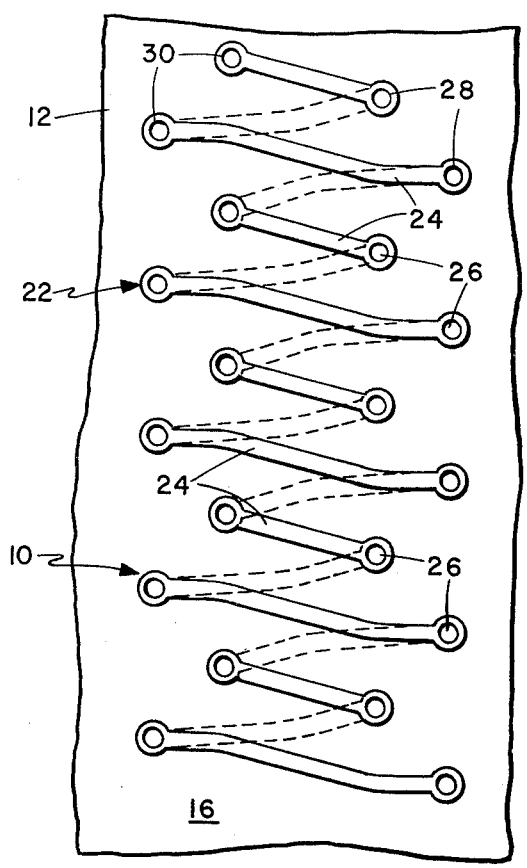
FIG. 2 illustrates the opposite face of the circuit board.
Figure 4:
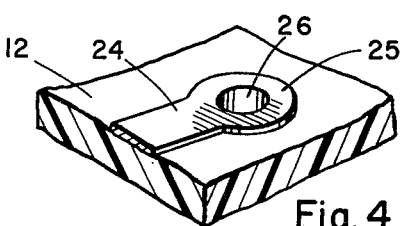
FIG. 4 is a perspective view of one end of a plated coil element.

Referring now to FIG. 4, it will be noted that each of the straps 24 terminates in a pad 25 surrounding the plated through holes 26. The pads are desirable to maximize the integrity of the electrical connections between the straps 24 and plated through holes 26. However, the pads 25 do increase the required spacing between adjacent turns of the coil 10. It has been discovered that a staggered hole relationship may be utilized to advantage with the coil of the invention to maximize the inductance per unit area of circuit board. The relationship between the staggered holes in the first and second surfaces of the board will be best understood by reference to FIGS. 1 and 2. The pattern of holes 26 for both first and second series of holes 28 and 30 is such that alternate holes 26 are closer and further away from the axis of the helix formed by the coil 10. On the first surface 14 of the board 12, the straps 24 are all of substantially equal length and extend between alternate inner and outer holes in the adjacent series of holes, as in FIG. 1. On the second side 16 of the board 12, the straps 24 are unequal in length and alternately extend between the closest or inner holes and the most widely spaced or outer holes 26, as in FIG. 2. Accordingly, room is provided for the pads 25 without necessitating excessive spacing between the coils.

In the manufacture of a coil according to the invention, the fiberglass board is first plated with copper. Secondly, the hole pattern for the series of holes 28 and 30 are drilled through the board. Photoresist material is then applied over the entire board and holes. The photoresist is developed in those areas where it is desired to remove the electrically conductive copper. The developed photoresist is then washed away leaving a protective coating over the areas that are to have copper conductive material remain. The copper is etched from the board in all of the unprotected areas. High temperature oil is utilized to clean away the developed photoresist and exposes the copper and the holes 26. A tin-lead solder (not illustrated) is applied in a thin layer extending along all of the copper surfaces and between the copper surfaces in the plated through holes 26. The resulting pattern is mechanically strong. The assembly of components to the board with the pattern applied is compatable with normal assembly processes.

Thus, the invention reduces the skilled labor requirements and results in a high performance inductive circuit component with stable operating characteristics.

Having described my invention, I now claim:

1. A flat coil inductor for electronic circuit boards, comprising:
   a circuit board having first and second spaced, generally flat electrically insulated surfaces,
   at least a first and a second series of holes extending along said surfaces and extending through said board,
   said first series of holes being generally parallel to said second series of holes,
   a first conductive pattern applied to a first surface of said board and comprising a first series of straps connecting between said first and second series of holes,
   a second conductive pattern applied to said second surface of said board and comprising a second series of straps extending between said first and second series of holes,
   a conductive layer on at least a portion of the walls of said holes, said conductive layer completing an electrical circuit through said straps and holes forming at least one generally helical pattern,
   conductive paths surrounding said holes,
   the axis of said helix is between and parallel to said first and second series of holes,
   individual holes in said series of holes are in a staggered pattern, alternate holes being spaced closer to and further from said axis,
   on one of said surfaces said straps alternately extend between the more closely spaced pairs of holes,
   on the other of said surfaces said straps extend between equally spaced but alternately staggered pairs of holes.

2. The flat coil conductor according to claim 1 wherein:
   said conductive layer on the wall of said holes leaves an opening extending between said first and said second surfaces,
   said opening being substantially 0.031" in diameter.

* * * * *